(12) United States Patent
Ma

(10) Patent No.: US 7,207,808 B2
(45) Date of Patent: Apr. 24, 2007

(54) LGA SOCKET CONNECTOR HAVING DETACHABLE ALIGNING KEY

(75) Inventor: Hao-Yun Ma, Tu-Cheng (TW)

(73) Assignee: Hon Hai Precision ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/273,346

(22) Filed: Nov. 14, 2005

(65) Prior Publication Data

US 2006/0105608 A1    May 18, 2006

(51) Int. Cl.
    *H01R 12/00* (2006.01)
(52) U.S. Cl. ............................................... 439/71
(58) Field of Classification Search ................ 439/71, 439/73, 331, 677, 66
    See application file for complete search history.

(56) References Cited

U.S. PATENT DOCUMENTS

| | | | | |
|---|---|---|---|---|
| 5,161,983 A | * | 11/1992 | Ohno et al. | 439/71 |
| 6,027,345 A | * | 2/2000 | McHugh et al. | 439/66 |
| 6,626,683 B2 | * | 9/2003 | Lai | 439/73 |
| 6,702,588 B1 | * | 3/2004 | McHugh et al. | 439/71 |
| 6,811,408 B2 | * | 11/2004 | Achammer et al. | 439/66 |
| 6,881,073 B2 | * | 4/2005 | Bali et al. | 439/70 |
| 6,945,788 B2 | * | 9/2005 | Trout et al. | 439/66 |
| 2005/0014400 A1 | * | 1/2005 | Liao | 439/73 |

* cited by examiner

*Primary Examiner*—Michael C. Zarroli
(74) *Attorney, Agent, or Firm*—Wei Te Chung

(57) ABSTRACT

Disclosed is an electrical socket connector (1) including an insulative housing (10) having a base (100) with a mating surface (100*a*) adapted to face a chip package (2), and a mounting surface (100*b*) adapted to face a printed circuit board. The base includes a peripheral wall (101) extending from edges thereof. A plurality of passageways (12) extends from the mating interface toward the mounting interface, with a plurality of terminals (14) each inserted into the passageways from the mating interface to the mounting interface. A detachable aligning key (16) is assembled to the base.

14 Claims, 12 Drawing Sheets

LGA SOCKET CONNECTOR HAVING DETACHABLE ALIGNING KEY

BACKGROUND OF THE INVENTION

1. Field of the Invention

The present invention relates to an electrical socket connector, and more particularly to an electrical socket connector having a detachable aligning key which can effectively prevent obstruction of manufacturing process of the socket connector.

2. Background of the Invention

LGA socket connector is an interface between a CPU chip and a motherboard of a computer. The CPU can only be performed properly through the socket connector. The existing LGA socket connector generally includes a base having a mating interface and a mounting interface. The base further includes a peripheral wall so as to jointly define a receiving space together with the base for receiving the CPU chip. A plurality of passageways extends from the mating interface toward the mounting interface. Each of the passageways is mounted with a terminal. After the terminals are assembled to the base, the sub-assembly is then disposed onto a metal stiffener which includes lever and clip to jointly press the CPU chip onto the base so as to make electrically connection between the CPU chip and socket. The general structure of the stiffener can be referred to U.S. Pat. Nos. 6,887,990; 6,805,561; 6,908,313 and 6,887,114.

The insulative housing generally has a rectangular shape, however, in the instance application, the insulative housing is a square shape. There is a rectangular hole in the middle of the housing as well. However, in some other applications, no hole is defined in the middle of the housing. The passageways is arranged in an array across the mating surface of the housing. In the existing so called 775 LGA socket, the array is 30×34. In assembly, the terminals are assembled into the passageways in sequential.

However, orientation is always an issue for electronic devices. There is no exception for CPU. Each contacting pads under the CPU is assigned to a pre-determined function. Incorrectly mounting the CPU onto the socket connector will not only render the CPU useless, but also will possible damage the socket connector. In order to ensure the CPU is correctly placed onto the socket connector, and make the CPU correctly function, the CPU chip is provided with a pair of notches along sides of the CPU chip. Meanwhile, the socket connector is also provided with a pair of aligning keys corresponding to those two notches. As such, when the notches and the aligning keys are correctly matched, it can be ensured that the CPU is correctly mounted onto the mating interface of the socket connector.

In the existing socket connector, the aligning keys are arranged on side wall of the housing in location adjacent to the 5th and 6th rows of passageways. Specially, those aligning keys extend from the side wall toward the passageway. As such, one of the aligning keys is very close to the $5^{th}$ and $6^{th}$ passageways. Not only no passageways can be defined adjacent to the base, but also this aligning key will affect the processes of inserting the terminals into the passageways. Accordingly, the total numbers of the passageways in the 5th and 6th rows are 28, instead of 30.

Since the numbers of the passageways of the 5th and 6th rows are different with others, the whole manufacturing processes will be affected. On the other hand, as the aligning keys extend from the side wall toward the passageways, this will also affect the manufacturing process.

SUMMARY OF THE INVENTION

In order to resolve the existing issues encountered by the industry, the inventor provides the following solutions so as to overcome the shortcoming of the existing design. According to one of the preferred embodiments, an aligning key is formed individually from the housing and which can be assembled to the housing after the terminals are assembled into the passageways. As such, during the inserting process of the terminals, the whole process will not be affected.

According to one of the solutions provided by the inventor, the aligning key is assembled to the housing by means of interference fit. In one embodiment, the aligning key is inserted into a recess defined in a sidewall of the base.

According to another solution provided by the inventor, the aligning key includes a pair of legs sandwiched onto the base. In the preferred embodiment, the aligning key is sandwiched onto the sidewall of the base.

According to another solution provided by the inventor, the aligning key is made from metal.

In order to achieve the objectives set forth, an electrical socket connector in accordance with the present invention includes an insulative housing having a base with mating interface adapted to face a chip package, and a mounting interface adapted to facing a printed circuit board. The base further forms peripheral wall extending from edges of the base. A plurality of passageway extend from the top interface toward the mounting interface with a plurality of terminal each inserted into the passages from the mating interface to the mounting interface. And a detachable aligning key assembled to the base.

According to one of the embodiments of the present invention, the sidewall is provided with a cutout in which the aligning key is mounted.

Still according to another embodiment of the present invention, the aligning key is provided with a pair of keys clipping onto the sidewall.

According to another embodiment of the present invention, the base is provided with a recess in which one of the legs of the aligning key is frictionally inserted therein.

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF PREFERRED EMBODIMENTS

Figure 1:
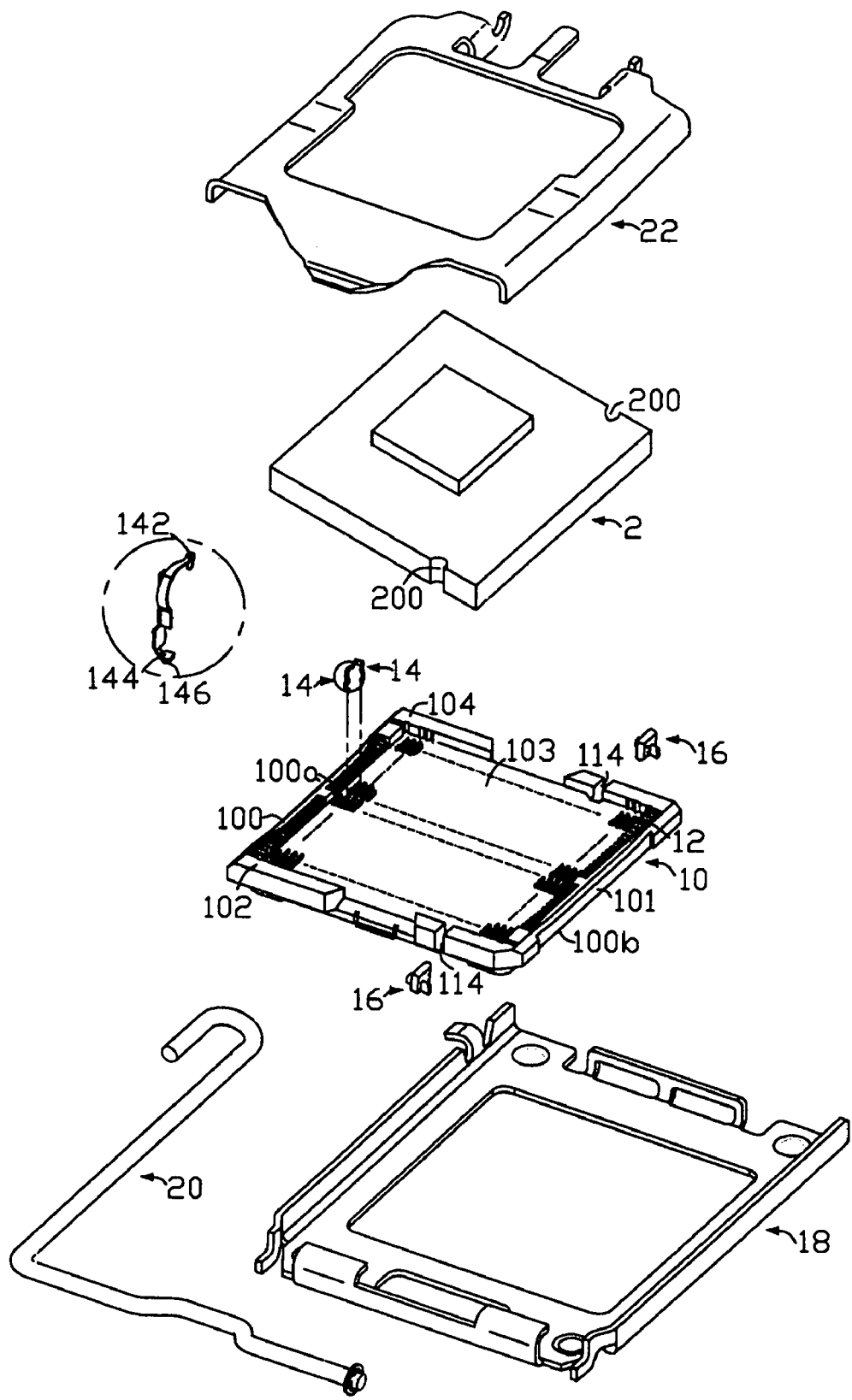
FIG. 1 is a simplified, exploded isometric view of an electrical connector according to a first preferred embodiment of the present invention.
Figure 2:
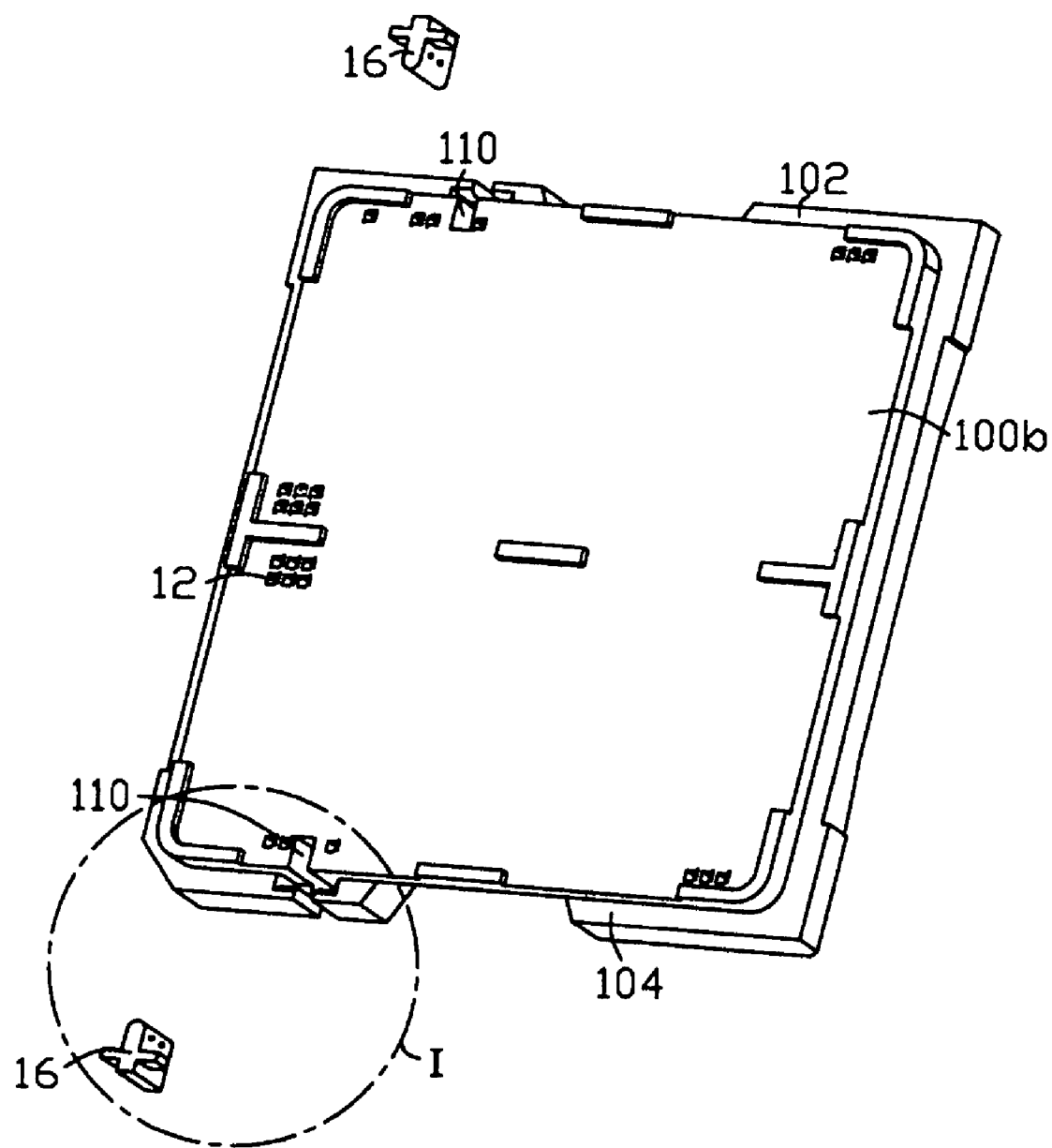
FIG. 2 is an inverted, isometric view of an electrical connector housing of FIG. 1.
Figure 3:
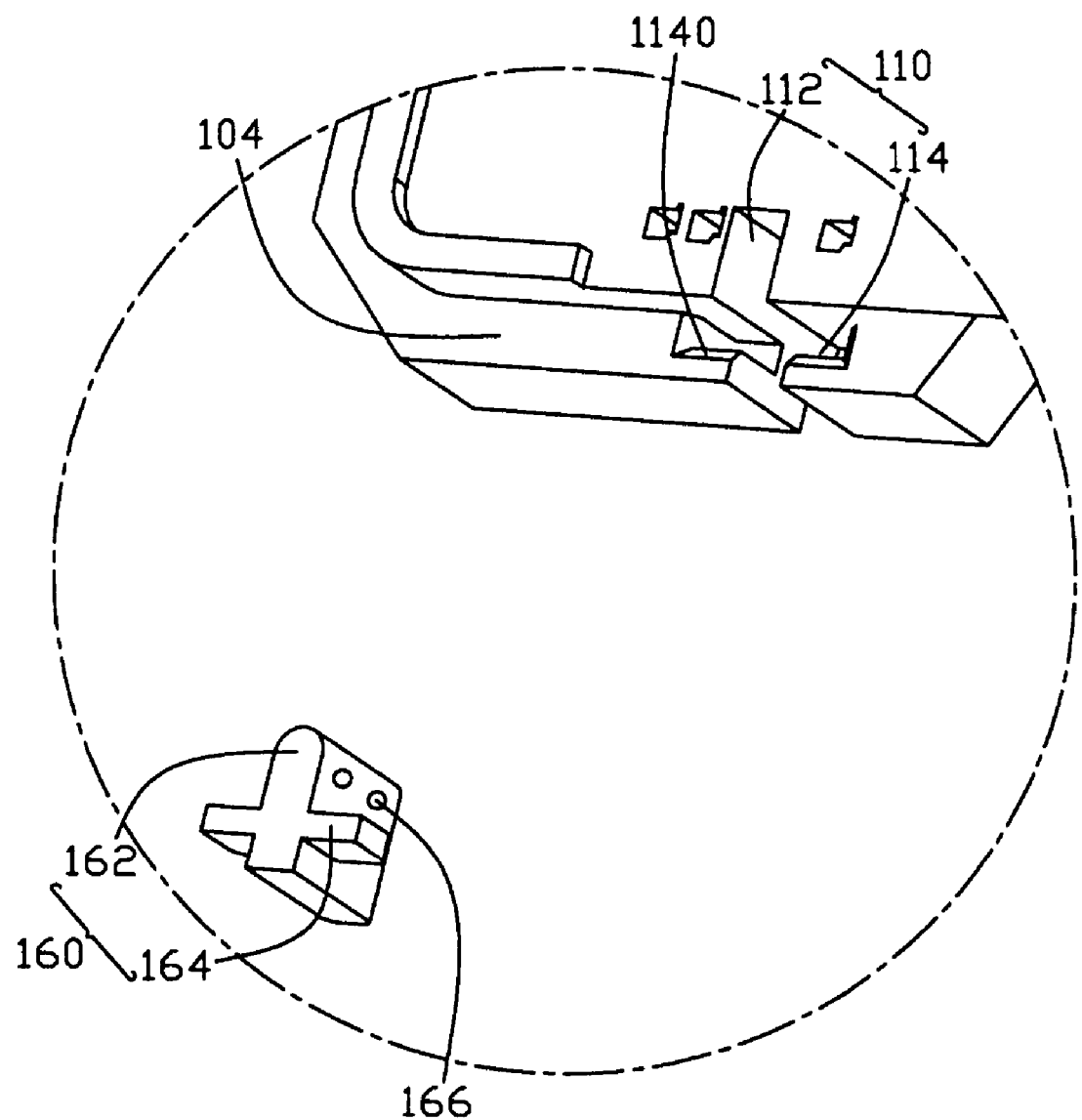
FIG. 3 is an enlarged, isometric view of a circle-shaped portion of FIG. 2.
Figure 4:
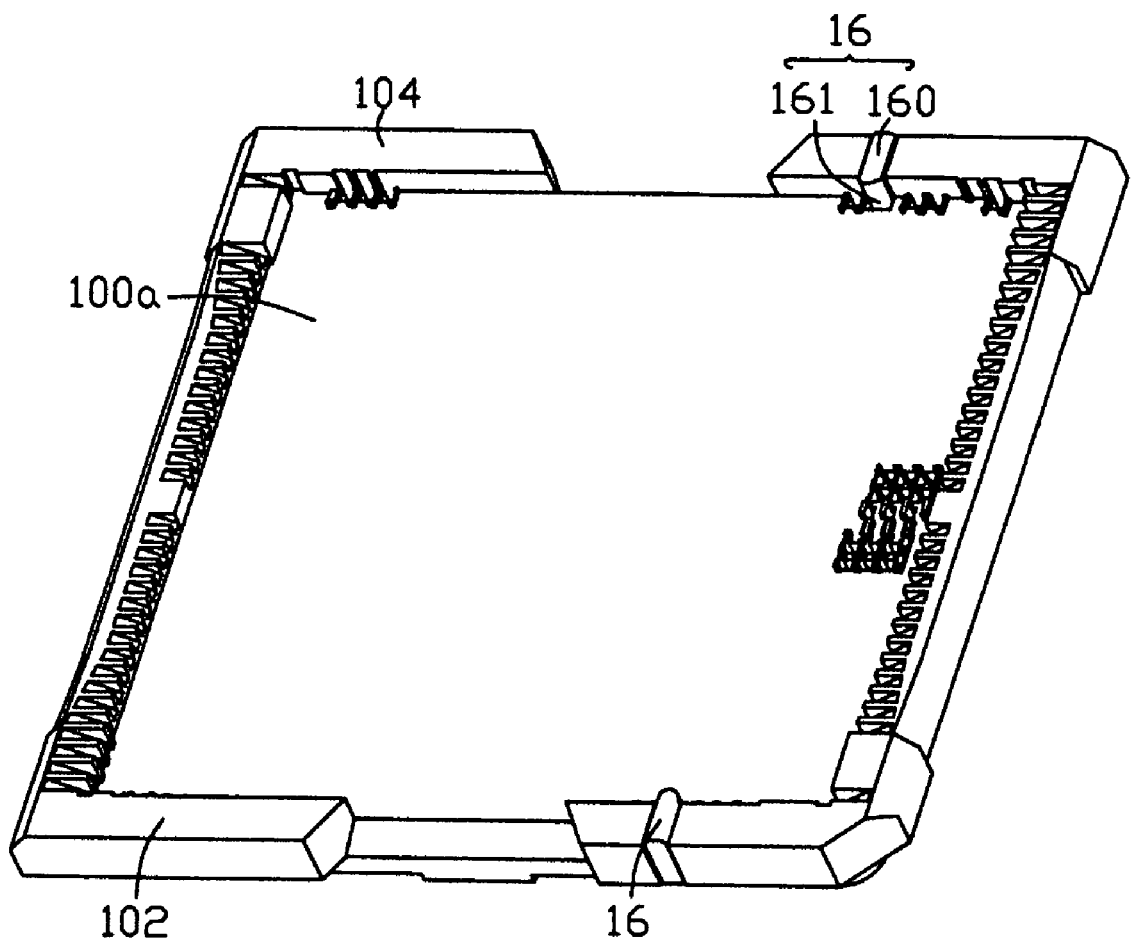
FIG. 4 is an assembled, isometric view of the electrical connector housing of FIG. 1.
Figure 5:
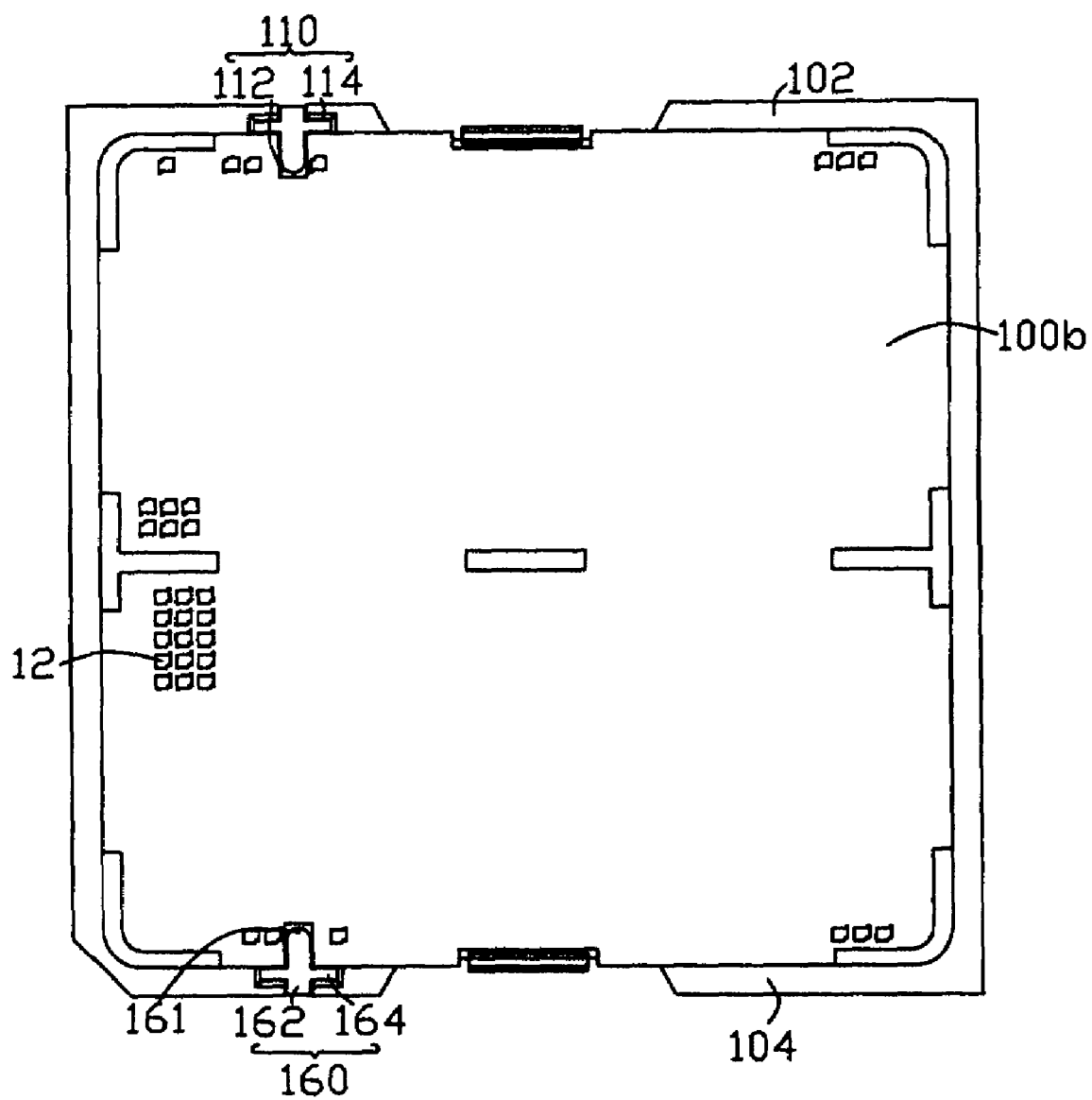
FIG. 5 is an inverted, plan view of the electrical connector housing of FIG. 4.

Referring to FIGS. 1 to 6, an electrical socket connector 1 according to the first preferred embodiment of the present invention includes an insulative housing 10 having a base 100 with a mating surface 100a adapted to face a chip package 2 typically a CPU chip, and a mounting surface 100b adapted to face a printed circuit board (not shown). The base 100 further includes a peripheral wall 101 so as to jointly define a receiving space 103 together with the base 100 for receiving the CPU chip 2. A plurality of passageways 12 extends from the mating interface 100a toward the mounting interface 100a, with a plurality of terminals 14 each inserted into the passageways 12 from the mating interface 100a to the mounting interface 100b. After the terminals 14 are assembled into the passageways 12, a pair of detachable aligning keys 16 is assembled to the base 100 by interference fit, which will be described in detail hereinafter. Such a sub-assembly is then disposed onto a metal stiffener 18, which further includes a lever 20 and a clip 22 to jointly press the CPU chip 2 onto the base 100 so as to make electrically connection between the CPU chip 2 and the electrical socket 1.

According to the preferred embodiment, each of the terminals 14 includes a contact engaging portion 142 that extends from the corresponding passageway 12 and beyond the mating interface 100a, and a mounting portion 144 on which a solder ball 146 is attached thereon. The contact engaging portion 142 is adapted to mate with a corresponding conductive pad (not shown) of the CPU chip 2, while the mounting portion 144 is adapted to mate with a corresponding conductive pad (not shown) of the printed circuit board.

In this embodiment, the CPU chip 2 is provided with a pair of notches 200 along opposite sides thereof. The notches 200 generally have a semi-circular shape, and cooperate with the detachable aligning keys 16 to work as an indicator for the CPU chip 2 to be correctly mounted on the electrical socket 1.

Referring to FIGS. 2 to 5, the pair of detachable aligning keys 16 is formed individually from the base 100, and more specifically, the aligning keys 16 are assembled to sidewalls 102, 104 of the base 100 with interference fit. Each of the aligning keys 16 is preferably made of plastic material, and includes a main body 160 and a header 161 extending from the main body 160. The header 161 has a curved surface that conforms to the shape of the notch 200 of the CPU chip 2 such that the header 161 matches with the notch 200 of the CPU chip 2. The main body 160 further includes a first transversal bar 162 and a second cross bar 164. The first transversal bar 162 and the second cross bar 164 are so arranged that the first transversal bar 162 extends more upwardly and inwardly from the base 100 than the second bar 164 while still being perpendicular to the second cross bar 164. This arrangement ensures the aligning keys 16 are substantially symmetrical about the first transversal bars 162 to make the aligning keys 16 to be held securely on the sidewalls 102, 104 of the base 100 by interference fit. In addition, the first transversal bar 162 is further provided with a plurality of protrusions 166 on the surface thereof, for enhanced interference fit with the sidewalls 102, 104 of the base 100.

The base 100 has opposed sidewalls 102, 104 defining a pair of recessed areas 110 to receive the respective aligning keys 16 therein. The recessed areas 110 have a shape to comply with the aligning keys 16, and each of the recessed areas 110 is composed of first and second slots 112, 114 for corresponding to the first and second bars 162, 164, respectively. The second slot 114 is further provided with a beveled lead edge 1140 along at least one side thereof, thereby facilitating the aligned keys 16 to be inserted into the slots 112, 114 when the aligning keys 16 are assembled to the base 100.

Figure 6:
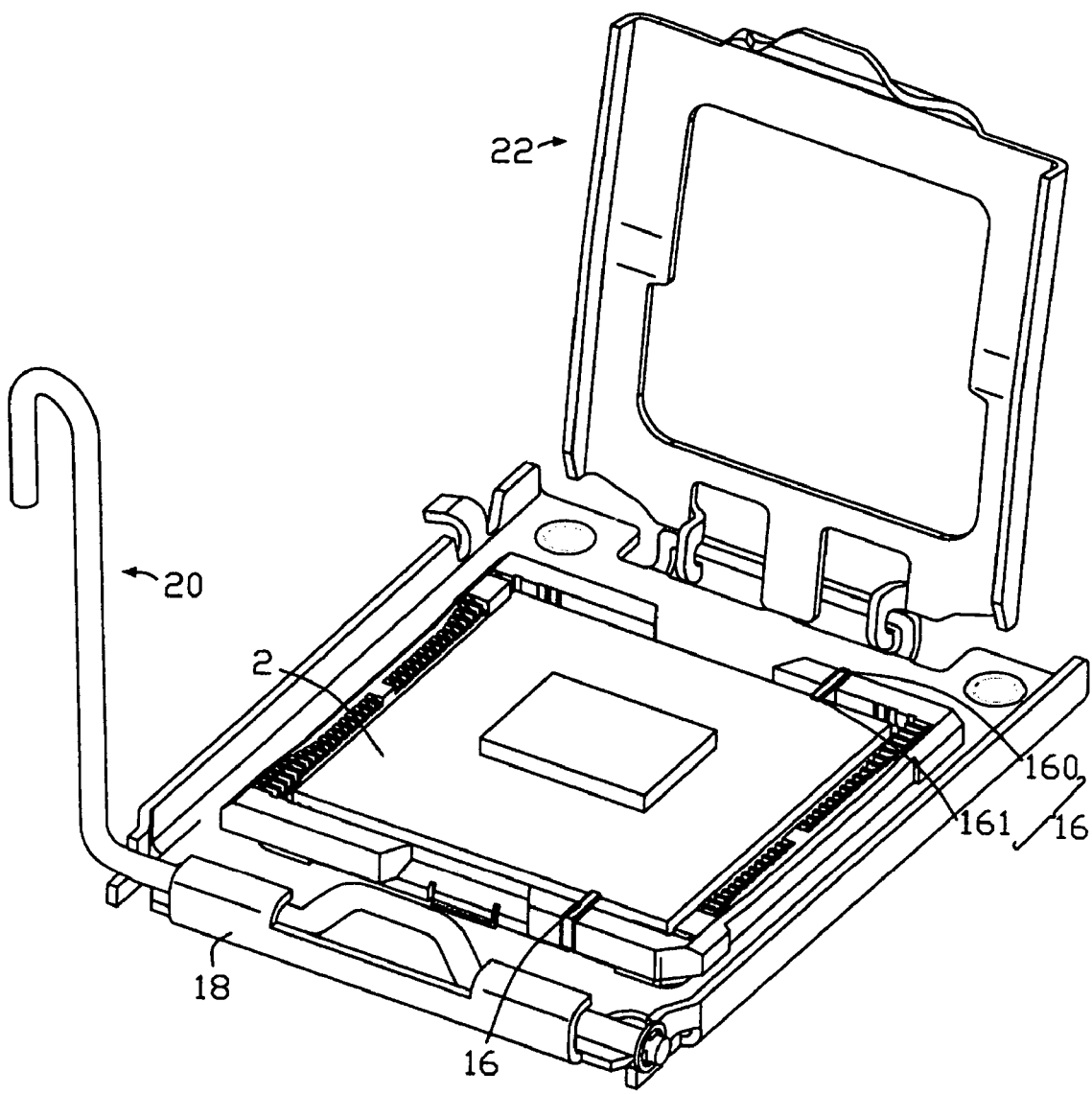
FIG. 6 is an assembled, isometric view of the electrical connector of FIG. 1, but showing the electrical connector in an opened position.

As shown in FIG. 6, the aligning keys 16 so assembled have the headers 162 extend slightly inward from the base 100 to match with the notches 200 of the CPU chip 2, which has already been placed on the base 100. Correctly matching between the headers 162 and the notches 200 can be ensured the CPU chip 2 is correctly mounted onto the socket connector 1. It should be noted that the detachable aligning keys 16 are assembled to the base 100 after the terminals 14 are assembled to the base. Accordingly, such aligning keys 16 will no longer affect the process of inserting the terminals 14 into the base 100, because there is none of aligning keys 16 existing during the insertion of the terminals 14.

While the CPU chip 2 is generally formed with semi-circular notches 200 in the preferred embodiment, any other CPU chip with notches of different shapes, such as triangular, rectangular or circular etc., may also be employed in other embodiments of the present invention. Of course, the aligning keys 16 also have a triangular, rectangular or circular cross-section shape in order to match with the notches 200 of the CPU chip 2. Further, the aligning keys 16 may be located at any suitable position of the base 100 other than the sidewalls 102, 104 of the base shown in FIGS. 1 to 6.

Figure 7:
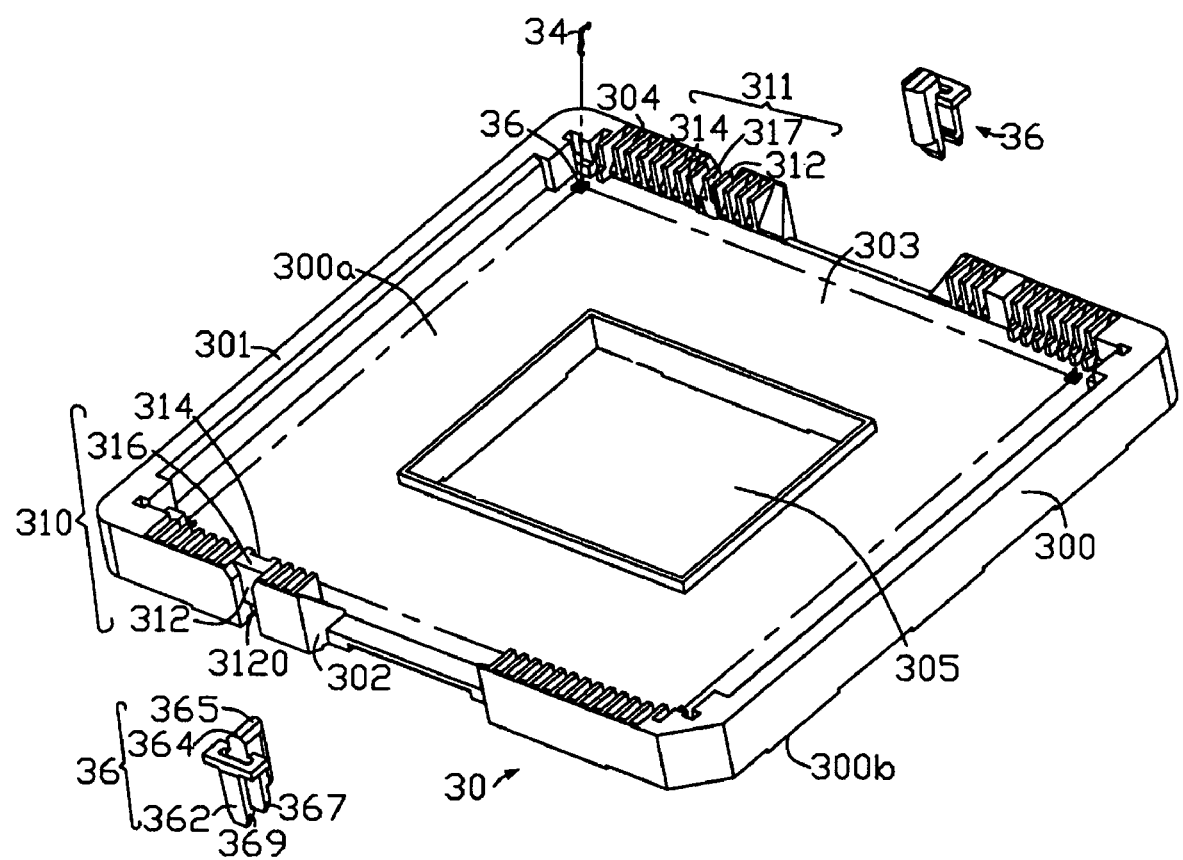
FIG. 7 is a simplified, exploded isometric view of an electrical connector housing according to a second preferred embodiment of the present invention, with a detachable aligning key ready to be received therein.
Figure 8:
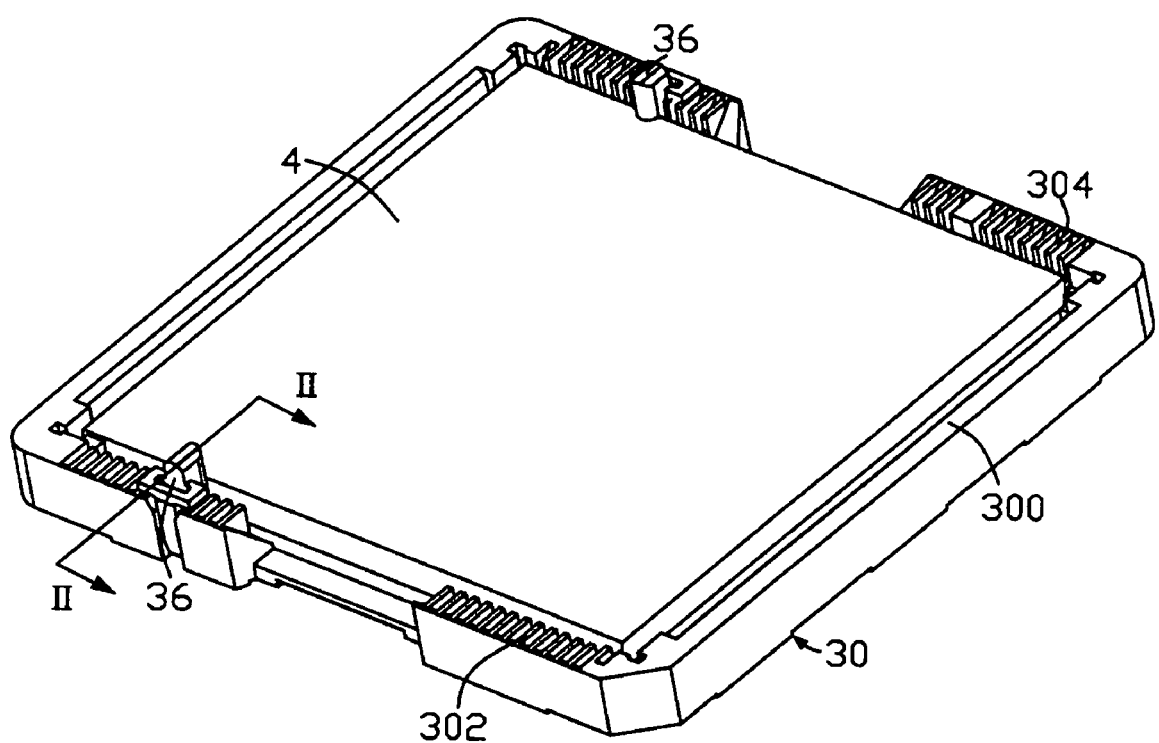
FIG. 8 is an assembled, isometric view of the insulative housing of FIG. 7.
Figure 9:
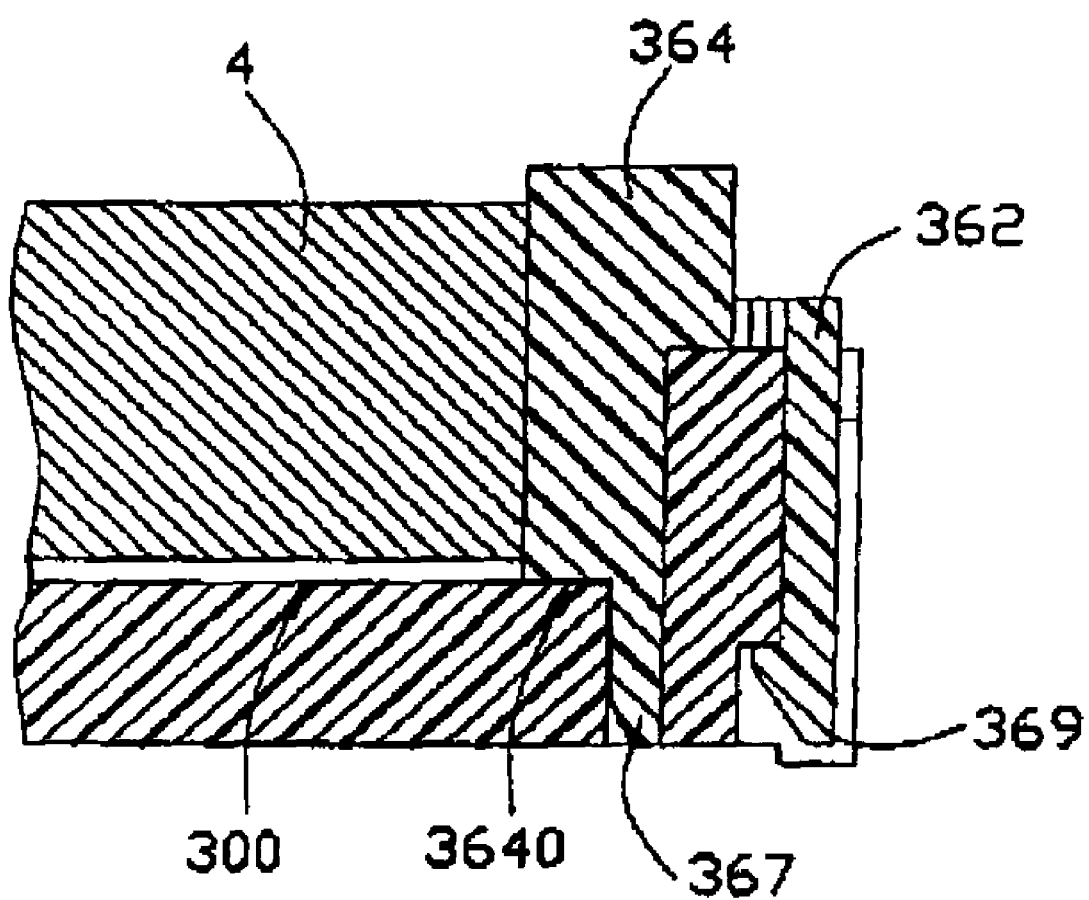
FIG. 9 is a cross section view of part of the assembled housing taken on the line II—II of FIG. 8.

Referring to FIGS. 7 to 9, an electrical socket connector 3 according to the second preferred embodiment of the present invention includes an insulative housing 30 having a base 300 with a mating surface 300a adapted to face a chip package 4, typically a CPU chip, and a mounting surface 300b adapted to face a printed circuit board (not shown). The base 300 further includes a peripheral wall 301 so as to jointly define a receiving space 303 together with the base 300 for receiving the CPU chip 4. A rectangular hole 305 is defined in the middle of the base 300. A plurality of passageways 32 is disposed round the rectangular hole 305 to extend from the mating interface 300a toward the mounting interface 300b. And a plurality of terminals 34 is inserted into the respective passageways 32 from the mating interface 300a to the mounting interface 300b. After the terminals 34 are assembled into the passageways 32, a pair of detachable aligning keys 36 is assembled to the base 300. More specifically, the aligning keys 36 are clipped onto sidewalls 302, 304 of the base 300.

According to the preferred embodiment, the aligning keys 36 are made of plastic material. However, the aligning key 36 may have any other suitable material, such as metal, metal alloy or the combination thereof, depending on where the aligning key is applicable.

Referring to FIG. 7, each of the aligning keys 36 further includes a first key leg 362, and a second key leg 364 that is substantially parallel to the first key leg 362. Ends of the first and second key legs 362, 364 are preferably shaped to effect a locking action when frictionally inserted into first and second slots 312, 314, as by forming catches 367, 369 at the ends of the key legs 36. The second key leg 364 is further formed with a header 365 having a semi-circular cross-section shape to match with a corresponding notch 400 of the CPU chip 4.

The base 300 has opposed sidewalls 302, 304 defining a pair of recessed areas 310, 311 to receive the respective aligning keys 36 therein. Each of the recessed areas 310, 311 is provided with first and second slots 312, 314 that is separated by a shoulder 316 or 317. Typically, the shoulders 316, 317 are the same, however, in the preferred embodiment, the shoulder 316 is structurally different from the shoulder 317 due to the manufacturing consideration. As shown in FIG. 9, the first slot 312 is formed with a stepped end 3120 for engaging with the catch 369 of the first key leg 362. And the second slot 314 and the base 300 cooperatively form a step 3640 for the second key leg 364 to engage therewith.

In assembly, the first slot 312 is adapted to receive the first key leg 362 of the aligning key 36, while the second slot 314 is adapted to receive the second key leg 364 of the aligning key 36, which is partly supported by the shoulder 316 by engagement with a top surface of the shoulder 316. In other words, the aligning key 36 is sandwiched onto the sidewall 302 of the base 300 via the first and second key legs 362, 364. As shown in FIG. 8, a thickness of the sidewall 302 or 304 where the aligning key 36 is assembled is thinner than that of the rest of the sidewall 302 or 304.

As shown in FIG. 8, the aligning keys 36 so assembled have the headers 365 to extend slightly inward from the base 300 to match with the notches 400 of the CPU chip 4, which has already been placed on the base 300. It should be noted that the detachable aligning keys 36 are assembled to the base 300 after the terminals 34 are assembled to the base. Accordingly, such aligning keys 36 will no longer affect the manufacturing process of inserting the terminals 34 into the base 300, because there is none of aligning keys 36 existing during the insertion of the terminals 34.

Figure 10:
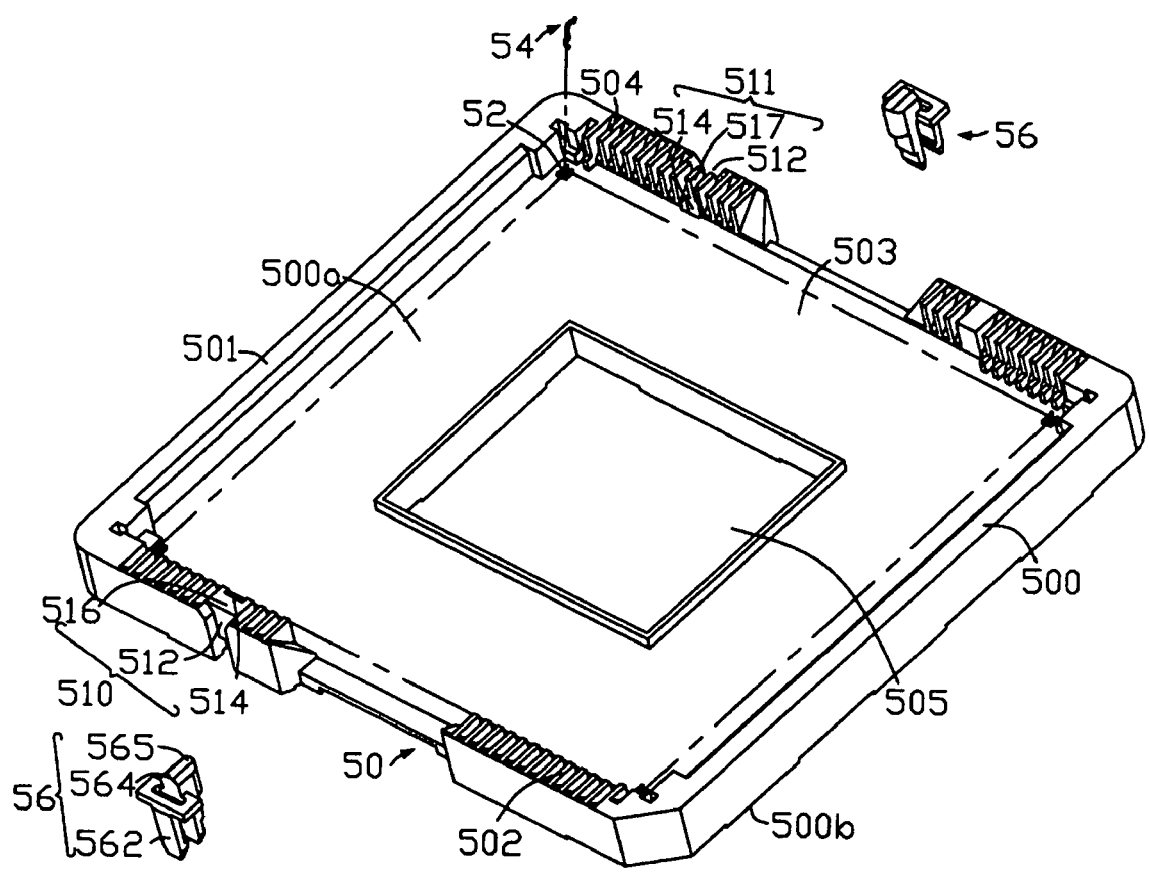
FIG. 10 is a simplified, isometric view of an electrical connector housing according to a third preferred embodiment of the present invention, with a detachable aligning key ready to be received therein.
Figure 11:
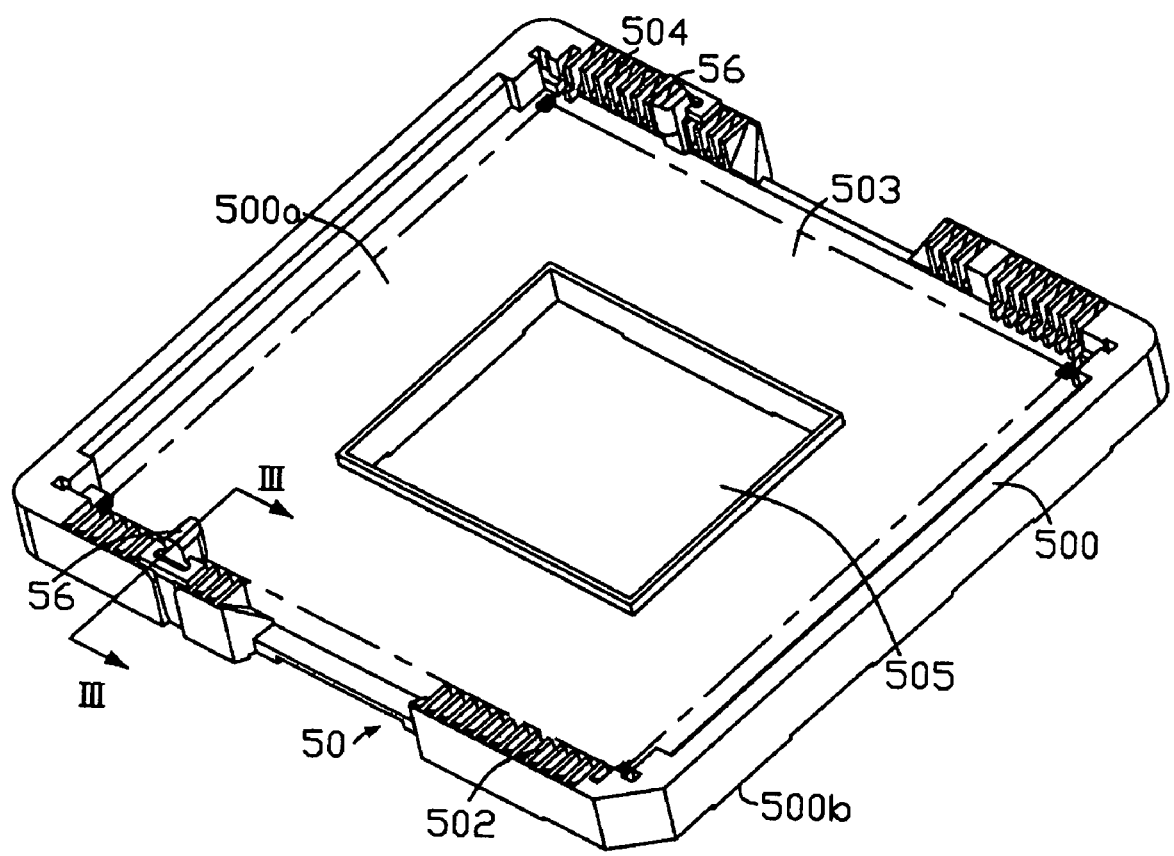
FIG. 11 is an assembled, isometric view of the insulative housing of FIG. 10.
Figure 12:
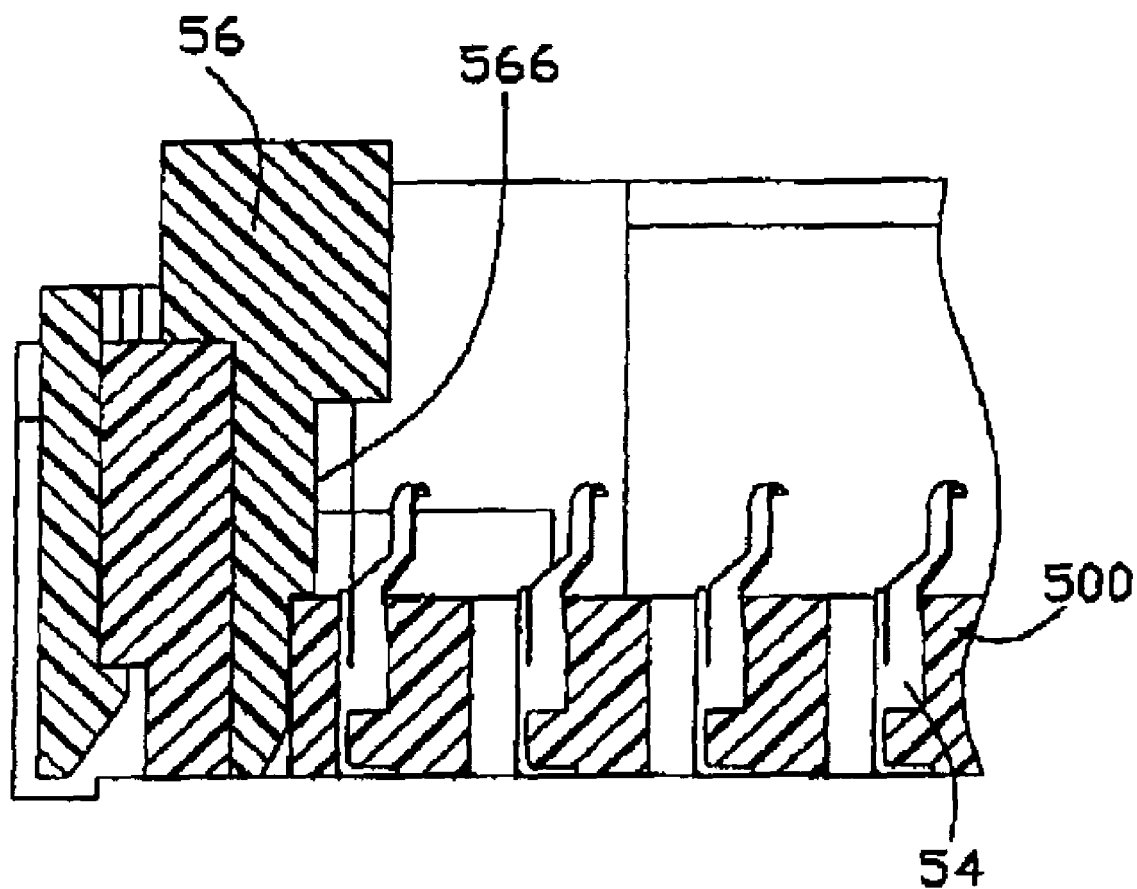
FIG. 12 is a cross section view of part of the assembled housing taken on the line III—III of FIG. 11.

Referring to FIGS. 10 to 12, an electrical socket connector 5 according to the third preferred embodiment of the present invention includes an insulative housing 50 having a base 500 with a mating surface 500a adapted to face a CPU chip 6, and a mounting surface 500b adapted to face a printed circuit board (not shown). The base 500 further includes a peripheral wall 501 so as to jointly define a receiving space 503 together with the base 500 for receiving the CPU chip 6. A rectangular hole 505 is defined in the middle of the base 505. A plurality of passageways 52 is disposed around the rectangular hole 505 to extend from the mating interface 500a toward the mounting interface 500b. And a plurality of terminals 54 is inserted into the respective passageways 52 from the mating interface 500a to the mounting interface 500b. After the terminals 54 are assembled into the passageways 52, a pair of detachable aligning keys 56 is clipped to the base 500.

The base 500 has opposed sidewalls 502, 504 defining a pair of recessed areas 510 for receiving the respective aligning keys 56. Each of the recessed areas 510, 511 is provided with first and second slots 512, 514 that is separated by a shoulder 516 or 517. Typically, the shoulders 516, 517 are the same, however, in the preferred embodiment, the shoulder 516 is structurally different from the shoulder 517 due to the manufacturing consideration.

The aligning keys 56 are preferably made of plastic material, although it may have any other material, such as metals, metal alloys or the combination thereof, if necessary. Referring to FIG. 9, each of the aligning keys 56 includes first and second key legs 562, 564 and a header 565 attached thereto. The header 565 is shaped to match with a corresponding notch 600 of the CPU chip 6.

The first key leg 562 and the second key leg 564 are substantially parallel with each other. The first key leg 562 is frictionally inserted into the first slot 512, and the second key leg 564 is frictionally inserted into the second slot 514, with at least a portion thereof supportably engaging with a top surface of the shoulder 516. That is, the aligning key 56 is sandwiched onto the sidewall 502 of the base 500 via the first and second key legs 562, 564. As shown in FIG. 8, a thickness of the sidewall 502 or 504 where the aligning key 56 is assembled is thinner than that of the rest of the sidewall 502 or 504.

In the preferred embodiment, the second key leg 564 is further formed with a stepped cutout 566 at a lower portion thereof. As such, referring to FIG. 12, when the aligning keys 56 are assembled to the base 500, a distance from an upper portion of the aligning key 56 to the adjacent passageway is shorter than a distance between the lower portion of the aligning key to the same adjacent passageway. Accordingly, not only passageways 52 can be defined adjacent the sidewalls 502, 504 where the aligning keys 56 are clipped, but also such aligning keys 56 will no longer affect the process of inserting the terminals 54 into the base 500 because there is none of aligning keys 56 existing during the insertion of the terminals 54.

As stated above, in the preferred embodiments, the aligning key 16, 36 or 56 is entirely made of plastic material. However, in some embodiments, the aligning key 16, 36 or 56 may be made of metal, metal alloy or the combination thereof, according to the intended purposes. Alternatively, in other embodiments, the aligning key 16, 36 or 56 may have all or a selected portion of its surface coated with a thin layer or film of metal, metal alloy or the combination thereof, for cost-down consideration.

Further, the aligning key 16, 36 or 56 may have any suitable cross-section shape, such as a triangular, rectangular or circular cross-section shape, other than the described-above semi-circular cross-section shape. Alternatively, the aligning key 16, 36 or 56 may have a portion thereof with a triangular, rectangular or circular cross-section shape, to match with varying kinds of the chip packages with different notches.

Moreover, in the preferred embodiments, the aligning key 16, 36 or 56 is merely shown to be assembled to the sidewall of the base. However, in other particular applications, the aligning key 16, 36 or 56 may be assembled to any suitable position of the base other than the sidewalls.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An electrical connector, comprising an insulative housing having a base with a mating interface adapted to face a chip package, and a mounting interface adapted to face a printed circuit board;
a peripheral wall extending from edges of the base;
a plurality of passageways extending from the top interface toward the mounting interface;
a plurality of terminals each inserted into the passageways from the mating interface to the mounting interface; and a detachable aligning key assembled to the base,
wherein the alignment key is clipped to the base and disposed in a side wall of the base,
wherein the base defines a recess adjacent the aligning key for receiving a first leg of the aligning key and wherein the base also forms a shoulder on the side wall for engaging with a second leg of the aligning key.

2. The electrical connector as recited in claim 1, wherein the aligning key is assembled to the base after the terminals are assembled to the base.

3. The electrical connector as recited in claim 1, wherein the aligning key is assembled to the base by interference fit.

4. The electrical connector as recited in claim 2, wherein the aligning key is assembled to a side wall of the base.

5. The electrical connector as recited in claim 4, wherein the aligning key is assembled to a recessed area of the side wall of the base.

6. The electrical connector as recited in claim 1, wherein a thickness of the side wall on which the aligning key clipped is thinner than a thickness of the rest of the side wall.

7. The electrical connector as recited in claim 6, wherein the side wall on which the aligning key clipped defines a first slot for receiving the first leg of the aligning key.

8. The electrical connector as recited in claim 7, wherein the side will on which the aligning key clipped defines a second slot for receiving the second leg of the aligning key.

9. The electrical connector as recited in claim 1, wherein the aligning key defines a cutout at a lower portion thereof.

10. The electrical connector as recited in claim 9, wherein a distance from upper portion of the aligning key to the adjacent passageway is shorter than a distance between the lower portion of the aligning key to the same adjacent passageway.

11. An electrical connector assembly comprising: an insulative housing defining a base surrounded by a plurality of side wails so as to form a receiving cavity above a top face of the base; a plurality of terminals disposed in the base with upper contacting portions extending upwardly from the top face of the base; and at least one aligning key discrete from the housing before being attached thereto and adjacent one of the side walls; wherein said aligning key laterally invades the receiving cavity, wherein the aligning key defines a cutout under a header thereof so as not to interfere with the corresponding terminal thereabouts.

12. The electrical connector as claimed in claim 11, wherein the base is not required to form a trough hole under said header for molding consideration.

13. The electrical connector as claimed in claim 11, wherein an block-like electronic component is received in the receiving cavity and defines a notch laterally receiving the aligning key.

14. A method of assembling an electrical connector, comprising steps of:
providing an insulative housing with a base surrounded by a plurality of side walls so as to define a receiving cavity above a top face of said base; providing a plurality of terminals in the base with upper contacting portions extending above the top face; and attaching an aligning key to the housing; wherein said aligning key laterally invades the receiving cavity, wherein said base defines a plurality of passageways and said terminals are inserted into the corresponding passageways, respectively, under a condition that the aligning key is attached to the housing after the terminals thereabouts are assembled to the base without possibility of interference between the aligning key and the terminals thereabouts.

* * * * *